US012432930B2

(12) United States Patent
Tomioka

(10) Patent No.: US 12,432,930 B2
(45) Date of Patent: Sep. 30, 2025

(54) MAGNETIC MEMORY DEVICE

(71) Applicant: Kioxia Corporation, Tokyo (JP)

(72) Inventor: Kazuhiro Tomioka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 723 days.

(21) Appl. No.: 17/471,989

(22) Filed: Sep. 10, 2021

(65) Prior Publication Data
US 2022/0293676 A1 Sep. 15, 2022

(30) Foreign Application Priority Data

Mar. 12, 2021 (JP) .................. 2021-040512

(51) Int. Cl.
H10B 61/00 (2023.01)
H10N 50/10 (2023.01)
H10N 50/80 (2023.01)
H10N 50/85 (2023.01)

(52) U.S. Cl.
CPC ............. *H10B 61/00* (2023.02); *H10N 50/10* (2023.02); *H10N 50/80* (2023.02); *H10N 50/85* (2023.02)

(58) Field of Classification Search
CPC ........ H10B 61/00; H10B 61/10; H10N 50/10; H10N 50/80; H10N 50/85; H10N 50/01
See application file for complete search history.

(56) References Cited

U.S. PATENT DOCUMENTS

| 8,604,569 B2 | 12/2013 | Hosotani et al. |
| 8,743,593 B2 | 6/2014 | Hayakawa et al. |
| 8,956,882 B1 | 2/2015 | Tomioka et al. |
| 9,093,632 B2 | 7/2015 | Tsubata et al. |
| 9,425,388 B2 | 8/2016 | Tomioka et al. |
| 9,508,922 B2 | 11/2016 | Yoshikawa et al. |
| 9,570,671 B2 | 2/2017 | Yoshikawa et al. |
| 9,595,663 B2 | 3/2017 | Yoshikawa et al. |
| 9,698,338 B2 | 7/2017 | Yoshikawa et al. |
| 9,916,882 B2 | 3/2018 | Shirotori et al. |
| 10,193,057 B2 | 1/2019 | Yoshikawa et al. |

(Continued)

FOREIGN PATENT DOCUMENTS

| JP | 2009094104 A | 4/2009 |
| JP | 5337817 B2 | 11/2013 |

(Continued)

OTHER PUBLICATIONS

U.S. Appl. No. 17/198,330, First Named Inventor: Takao Ochiai; Title: "Magnetic Memory Device and Manufacturing Method of Magnetic Memory Device"; Filed: Mar. 11, 2021.

*Primary Examiner* — Tucker J Wright

(74) *Attorney, Agent, or Firm* — Holtz, Holtz & Volek PC

(57) ABSTRACT

According to one embodiment, a magnetic memory device includes a bottom electrode, a stacked structure provided on the bottom electrode, and including a first magnetic layer having a variable magnetization direction, a second magnetic layer having a fixed magnetization direction, and a nonmagnetic layer provided between the first magnetic layer and the second magnetic layer, a first sidewall insulating layer provided on a sidewall of the bottom electrode and containing a predetermined element and oxygen (O), and a second sidewall insulating layer provided on a sidewall of the stacked structure and containing the predetermined element and oxygen (O).

18 Claims, 16 Drawing Sheets

(56) References Cited

U.S. PATENT DOCUMENTS

| | | | |
|---|---|---|---|
| 10,461,245 B2 | 10/2019 | Tsubata et al. | |
| 10,490,732 B2 | 11/2019 | Sonoda et al. | |
| 10,790,442 B2 | 9/2020 | Sonoda | |
| 10,847,576 B2 | 11/2020 | Tsubata et al. | |
| 2009/0091863 A1* | 4/2009 | Hosotani | H10N 50/10 |
| 2010/0059265 A1* | 3/2010 | Kim | H01L 23/5226 |
| | | | 29/846 |
| 2012/0244639 A1* | 9/2012 | Ohsawa | H10N 50/01 |
| | | | 257/E43.006 |
| 2015/0072440 A1 | 3/2015 | Inada et al. | |
| 2015/0263272 A1 | 9/2015 | Tomioka | |
| 2015/0263275 A1 | 9/2015 | Tomioka | |
| 2015/0295170 A1 | 10/2015 | Tsubata et al. | |
| 2016/0072047 A1 | 3/2016 | Seto et al. | |
| 2016/0072055 A1 | 3/2016 | Seto et al. | |
| 2017/0069836 A1 | 3/2017 | Tomioka | |
| 2019/0006580 A1 | 1/2019 | Yoshikawa et al. | |

FOREIGN PATENT DOCUMENTS

| | | |
|---|---|---|
| JP | 6200471 B2 | 9/2017 |
| WO | 2017029720 A1 | 2/2017 |

* cited by examiner

MAGNETIC MEMORY DEVICE

CROSS-REFERENCE TO RELATED APPLICATIONS

This application is based upon and claims the benefit of priority from Japanese Patent Application No. 2021-040512, filed Mar. 12, 2021, the entire contents of which are incorporated herein by reference.

FIELD

Embodiments described herein relate generally to a magnetic memory device.

BACKGROUND

Magnetic memory devices in which a magnetoresistance effect element is integrated on a semiconductor substrate have been proposed.

DETAILED DESCRIPTION

In general, according to one embodiment, a magnetic memory device includes: a bottom electrode; a stacked structure provided on the bottom electrode, and including a first magnetic layer having a variable magnetization direction, a second magnetic layer having a fixed magnetization direction, and a nonmagnetic layer provided between the first magnetic layer and the second magnetic layer; a first sidewall insulating layer provided on a sidewall of the bottom electrode and containing a predetermined element and oxygen (O); and a second sidewall insulating layer provided on a sidewall of the stacked structure and containing the predetermined element and oxygen (O).

The embodiments will now be described with reference to the accompanying drawings.

Embodiment 1

Figure 1:
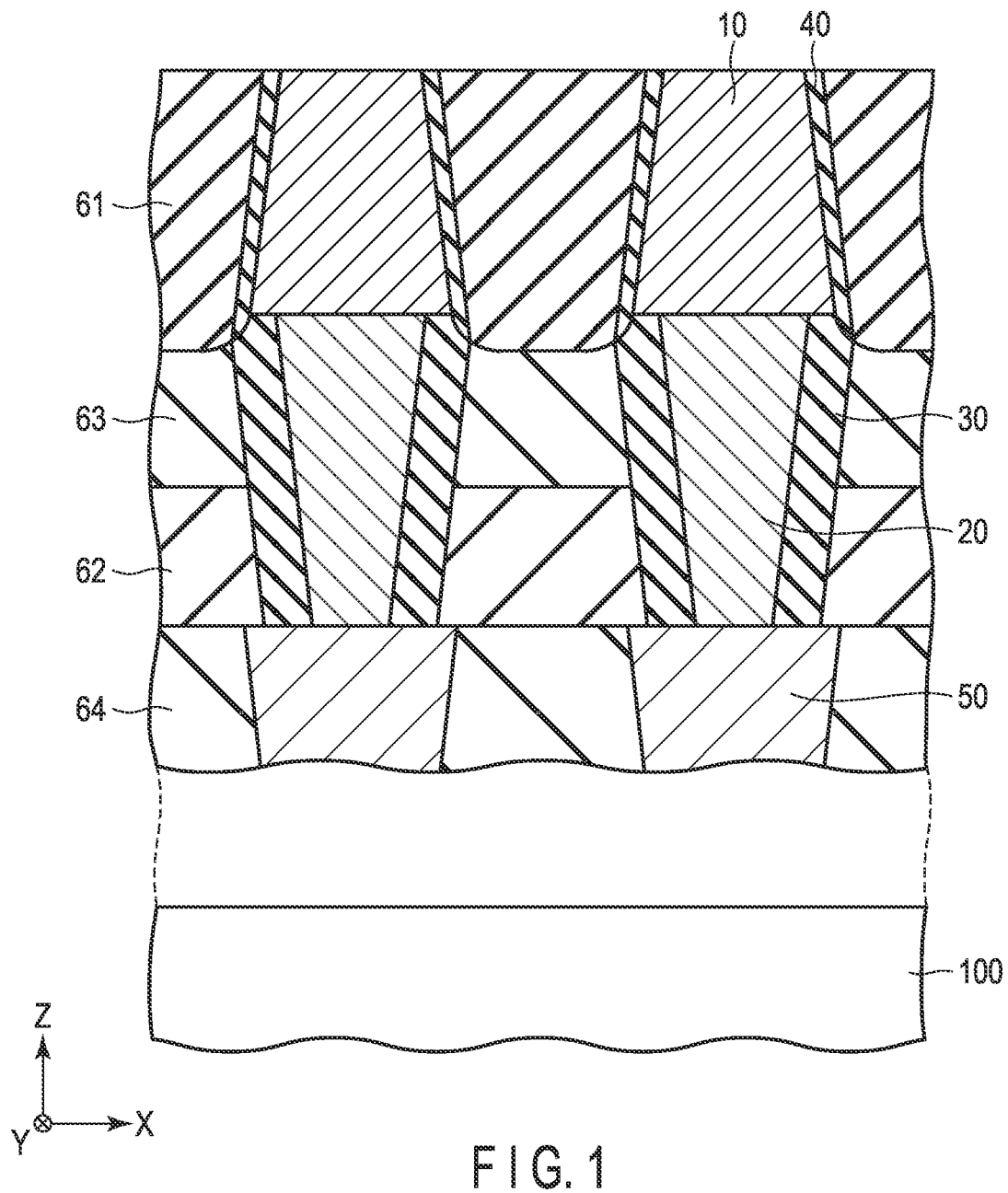
FIG. 1 is a cross-sectional view schematically showing a magnetic memory device of the first embodiment.

FIG. 1 is a cross-sectional view schematically showing the configuration of a magnetic memory device according to the first embodiment. X, Y, and Z directions shown in the figure are directions that intersect each other. More specifically, the X, Y and Z directions are orthogonal to each other.

As shown in FIG. 1, a stacked structure 10, a bottom electrode 20, a sidewall insulating layer (a first sidewall insulating layer) 30, a sidewall insulating layer (a second sidewall insulating layer) 40, a lower conductive layer 50 and insulating regions 61 to 64 are provided above a semiconductor substrate 100.

The stacked structure 10 constitutes a magnetoresistance effect element, and as the magnetoresistance effect element, a magnetic tunnel junction (MTJ) element is used.

Figure 2:
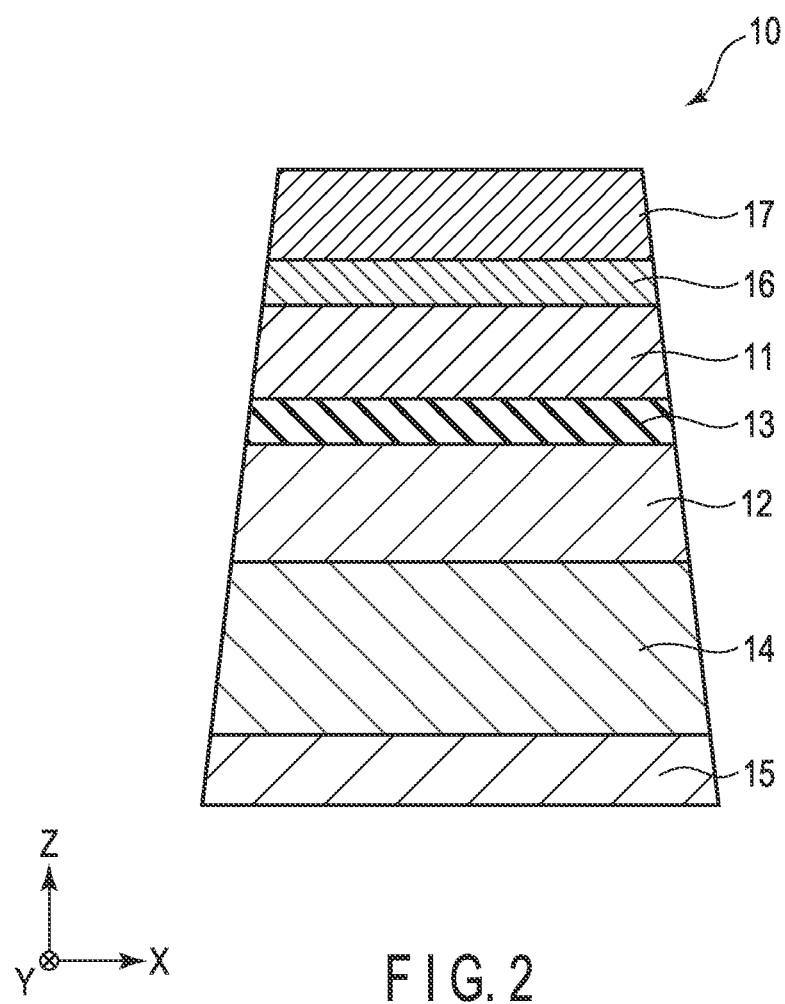
FIG. 2 is a cross-sectional view schematically showing a configuration of a stacked structure of the magnetic memory device according to the first embodiment.

FIG. 2 is a cross-sectional view schematically showing the configuration of the stacked structure 10.

The stacked structure 10 is provided on the bottom electrode (not shown) and comprises a storage layer (first magnetic layer) 11, a reference layer (a second magnetic layer) 12, a tunnel barrier layer (a nonmagnetic layer) 13, a shift-canceling layer (a third 24 magnetic layer) 14, a buffer layer 15, a cap layer 16 and an upper layer 17.

The storage layer (first magnetic layer) 11 is a ferromagnetic layer with a variable magnetization direction, and is made of a CoFeB layer containing cobalt (Co), iron (Fe) and boron (B). The variable magnetization direction means that the magnetization direction varies according to a predetermined write current.

The reference layer (second magnetic layer) 12 is a ferromagnetic layer with a fixed magnetization direction. The fixed magnetization direction means that the magnetization direction does not vary according to a predetermined writing current. The reference layer 12 includes an upper layer portion and a lower layer portion. The upper layer portion is formed of a CoFeB layer containing cobalt (Cc), iron (Fe) and boron (B). The lower layer portion contains cobalt (Co) and at least one element selected from platinum (Pt), nickel (Ni) and palladium (Pd).

The tunnel barrier layer (nonmagnetic layer) 13 is an insulating layer provided between the storage layer 11 and the reference layer 12. The tunnel barrier layer 13 is formed of an MgO layer containing magnesium (Mg) and oxygen (O).

The shift-canceling layer (third magnetic layer) 14 is a ferromagnetic layer having a fixed magnetization direction that is antiparallel to the magnetization direction of the reference layer 12, and has the function of canceling the magnetic field applied from the reference layer 12 to the storage layer 11. The shift-canceling layer 14 contains cobalt (Co) and at least one element selected from platinum (Pt), nickel (Ni) and palladium (Pd).

The buffer layer 15 is provided on a lower side of the shift-canceling layer 14 and is formed of a conductive material.

The cap layer 16 is provided on the storage layer 11 and is formed of magnesium oxide (MgO) or the like.

The upper layer 17 is provided on the cap layer 16 and is formed of a conductive material.

The magnetoresistance effect element constituted by the stacked structure 10 described above is a spin transfer torque (STT) type magnetoresistance effect element having perpendicular magnetization. In other words, the magnetization directions of the storage layer 11, the reference layer 12, and the shift-canceling layer 14 are perpendicular to their surfaces of the respective layer.

When the magnetization direction of the storage layer 11 is parallel to the magnetization direction of the reference layer 12, the magnetoresistance effect element is in a low-resistance state, and when the magnetization direction of the storage layer 13 is anti-parallel to the magnetization direction of the reference layer 12, the magnetoresistance effect element is in a high-resistance state. With these characteristics, the magnetoresistance effect element can store binary data depending on the resistance state of the magnetoresistance effect element. Further, it is possible to set the magnetoresistance effect element to a low resistance state or a high resistance state according to the direction of the current flowing through the magnetoresistance effect element.

Note that the magnetoresistance effect element shown in FIG. 2 is a top-free type magnetoresistance effect element in which the storage layer 11 is located on an upper layer side of the reference layer 12, but a bottom-free type magnetoresistance effect element in which the storage layer 11 is located on a lower layer 24 side of the reference layer 12 may as well be used.

The bottom electrode 20 functions as a bottom electrode of the magnetoresistance effect element and is formed of a conductive material such as titanium nitride (TiN).

A sidewall insulating layer (a first sidewall insulating layer) 30 is provided on a sidewall of the bottom electrode 20. More specifically, the sidewall insulating layer 30 is provided along the sidewall of the bottom electrode 20 and covers (surrounds) the entire sidewall of the bottom electrode 20. The sidewall insulating layer 30 is formed of an insulating material (oxide material) that contains a predetermined element and oxygen (O). Specifically, the sidewall insulating layer 30 is formed of a metal oxide that contains a predetermined element (a predetermined metal element). The predetermined element contained in the sidewall insulating layer 30 is selected from magnesium (Mg), boron (B), aluminum (Al), scandium (Sc), titanium (Ti), vanadium (V), strontium (Sr), yttrium (Y), zirconium (Zr), niobium (Nb), molybdenum (Mo) barium (Ba), hafnium (Hf), tantalum (Ta) and tungsten (W). In this embodiment, the sidewall insulating layer 30 is formed of magnesium oxide (MgO).

A sidewall insulating layer (a second sidewall insulating layer) 40 is provided on a sidewall of the stacked structure 10. More specifically, the sidewall insulating layer 40 is provided along the sidewall of the stacked structure 10 and covers (surrounds) the sidewall of the stacked structure 10. In this embodiment, the sidewall insulating layer 40 covers the entire sidewall of the stacked structure 10. However, it suffices if the sidewall insulating layer 40 covers at least side surfaces of the storage layer 11, the reference layer 12, the tunnel barrier layer 13 and the 24 shift-canceling layer 14. The sidewall insulating layer 40 is formed of an insulating material (oxide material) that contains the predetermined element contained in the sidewall insulating layer 30 and oxygen (O). In this embodiment, the sidewall insulating layer 40 is formed of magnesium oxide (MgO).

The lower conductive layer 50 is connected to a lower surface of the bottom electrode 20. The lower conductive layer 50 is used as a wiring line, for example, for word lines.

The side surface of the sidewall insulating layer 40 are covered (surrounded) by an insulating region 61 formed of an insulating material different from the material of the sidewall insulating layer 40. For example, the insulating region 61 is formed of silicon oxide or silicon nitride.

The side surface of the sidewall insulating layer 30 is covered (surrounded) by insulating regions 62 and 63 formed of an insulating material different from the material of the sidewall insulating layer 30. For example, the insulating region 62 is formed of silicon nitride and the insulating region 63 is formed of silicon oxide.

The side surface of the lower conductive layer 50 is covered by an insulating region 64. For example, the insulating region 64 is formed of silicon oxide or silicon nitride.

Figure 3:
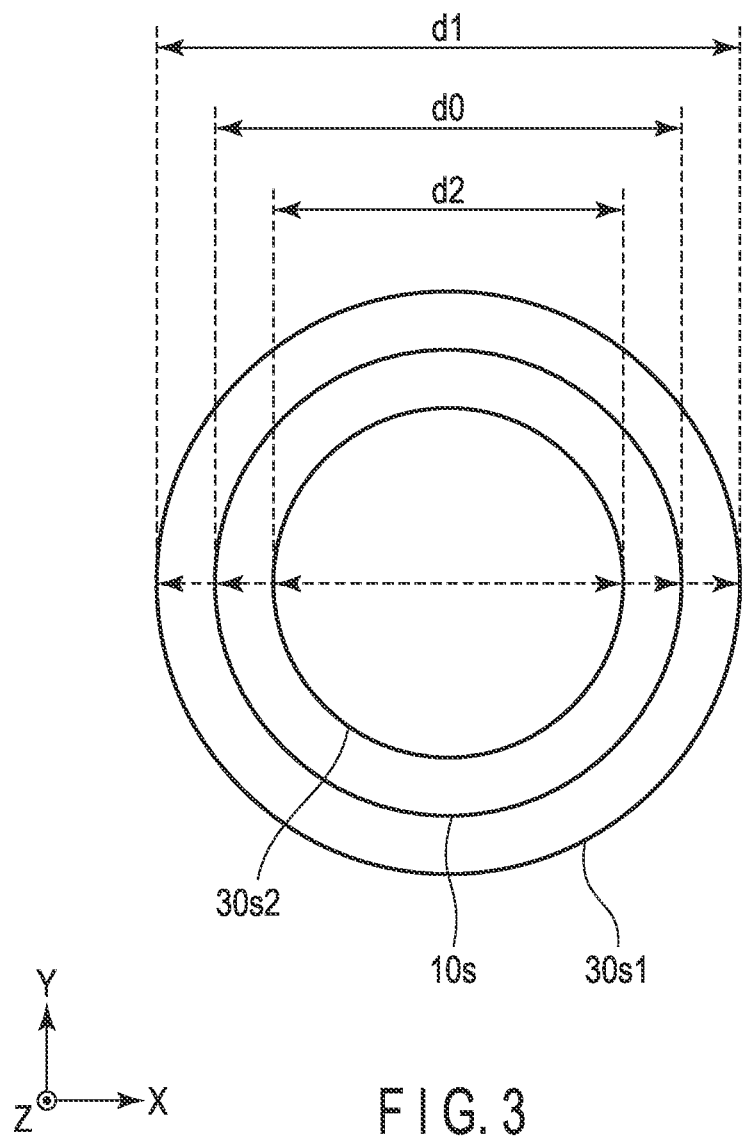
FIG. 3 is a diagram schematically showing the positional relationship between the pattern on a lower surface of the stacked structure and a pattern on an upper surface of the sidewall insulating layer of the magnetic memory device according to the first embodiment.

FIG. 3 is a diagram schematically showing the positional relationship between the pattern of the lower surface of the stacked structure 10 and the pattern of the upper surface of the sidewall insulating layer 30. More specifically, FIG. 3 schematically illustrates the relationship between an outer circumference 10s of the pattern of the lower surface of the stacked structure 10, an outer circumference 30s1 of the pattern of the upper surface of the sidewall insulating layer 30, and an inner circumference 30s2 of the pattern of the upper surface of the sidewall insulating layer 30.

As shown in FIG. 3, viewed from a direction parallel to the stacking direction (Z direction) of the stacked structure 10, a part of the pattern of the upper surface of the sidewall insulating layer 30 is located on an outer side of the pattern of the bottom surface of the stacked structure 10. From another perspective, a diameter d1 of the outer circumference 30s1 of the ring-shaped upper surface of the sidewall insulating layer 30 should preferably greater than a diameter d0 of the outer circumference 10s of the lower surface of the stacked structure 10. A diameter d2 of the inner circumference 30s2 of the ring-shaped upper surface of the sidewall insulating layer 30 should preferably be less than the diameter d0 of the outer circumference 10s of the lower surface of the stacked structure 10. In other words, it is preferable to satisfy the relationship: d1>d0>d2.

Note that the diameter d0 described above is an average diameter of the outer circumference 10s of the lower surface of the stacked structure 10, the diameter d1 is an average diameter of the outer circumference 30s1 of the ring-shaped upper surface of the sidewall insulating layer 30, and the diameter d2 is an average diameter of the inner circumference 30s2 of the ring-shaped upper surface of the sidewall insulating layer 30.

Next, a method of manufacturing the magnetic memory device of this embodiment will be described with reference to the cross-sectional views shown in FIGS. 4A to 4G.

Figure 4A:
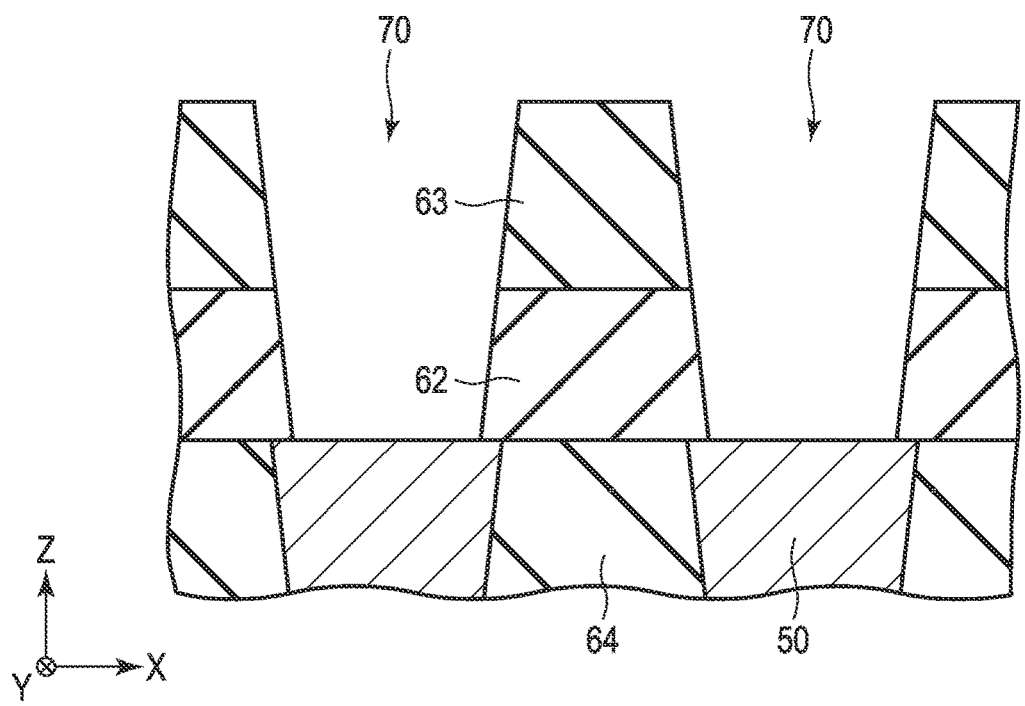
FIGS. 4A, 4B, 4C, 4D, 4E, 4F and 4G are cross-sectional views each schematically illustrating a part of a manufacturing method for the magnetic memory device according to the first embodiment.

First, as shown in FIG. 4A, an insulating region 64 and a lower conductive layer 50 are formed on a lower region including a semiconductor substrate (not shown) and the like. Then, insulating layers for the insulating region 62 and the insulating region 63 are formed on the insulating region 64 and the lower conductive layer 50. Further, these insulating layers are patterned to form a plurality of holes 70.

Figure 4B:
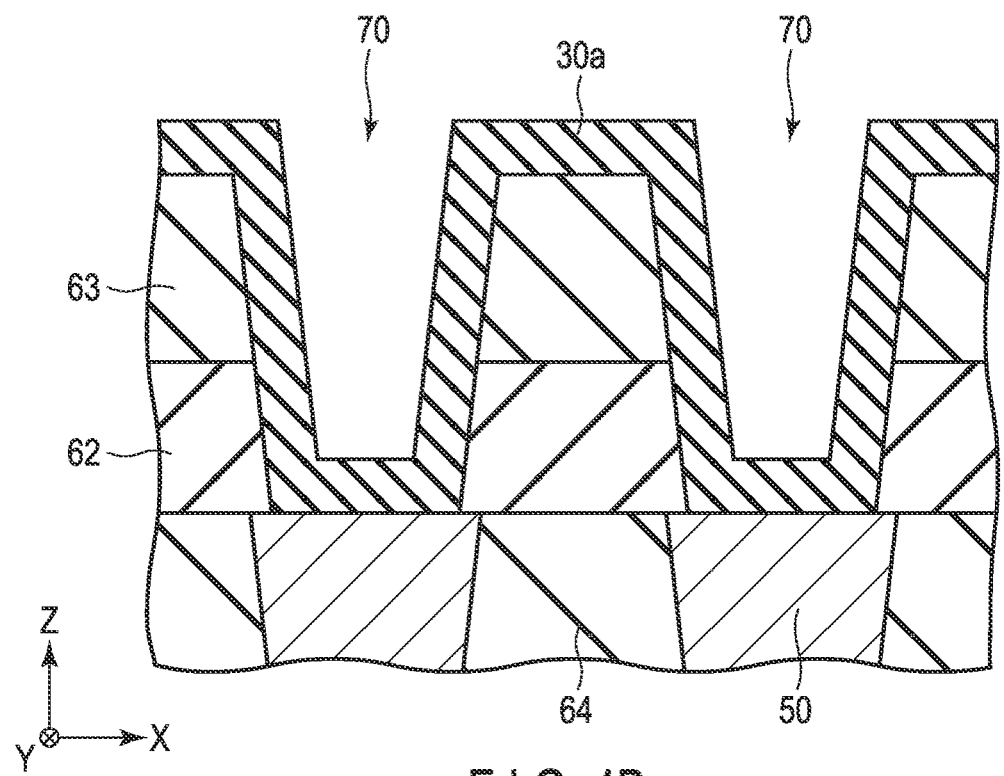

Next, as shown in FIG. 4B, an MgO layer is formed on the structure obtained in the step of FIG. 4A as the insulating layer 30a for the sidewall insulating layer 30 by chemical vapor deposition (CVD) or physical vapor deposition (PVD).

Figure 4C:
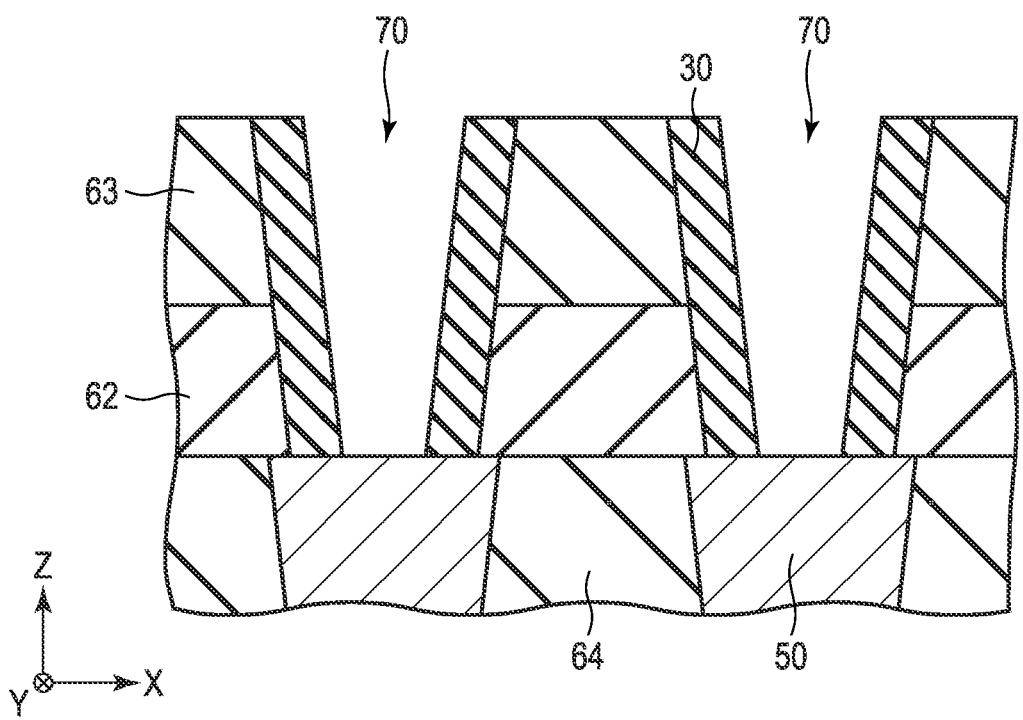

Subsequently, as shown in FIG. 4C, the insulating layer 30a is subjected to an etch-back process. As a result, the sidewall insulating layer 30 is formed on the side surface of the insulating regions 62 and 63.

Figure 4D:
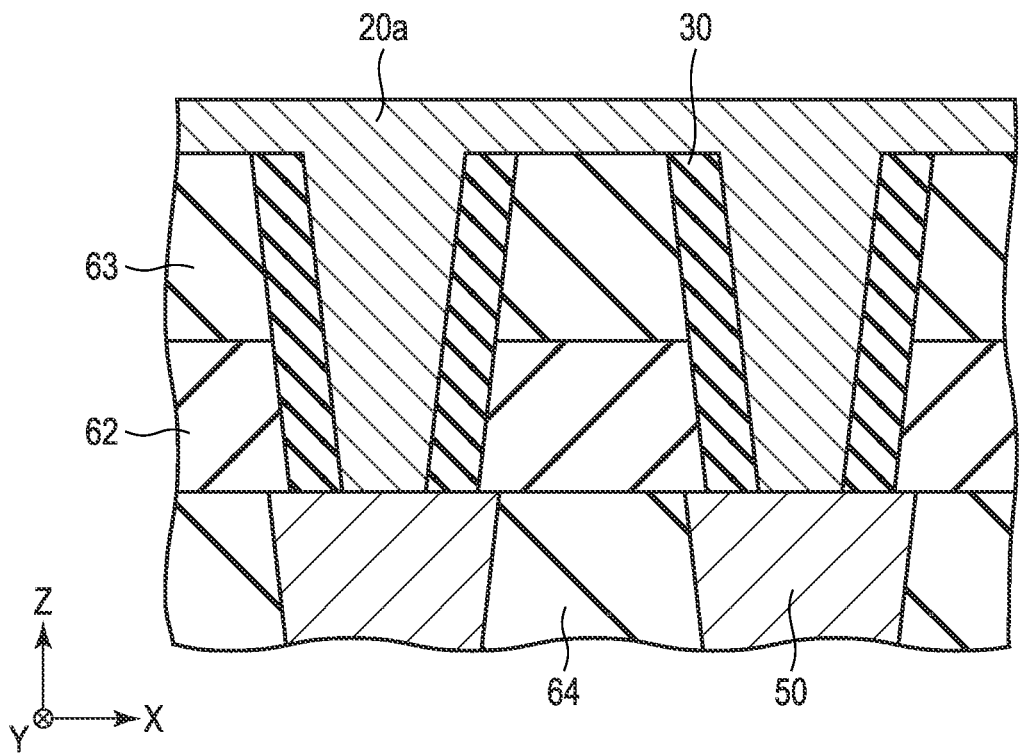

Then, as shown in FIG. 4D, a TiN layer is formed on the structure obtained in the step of FIG. 4C as the conductive layer 20a for the bottom electrode 20. As a result, the holes 70 are filled with the conductive layer 20a.

Figure 4E:
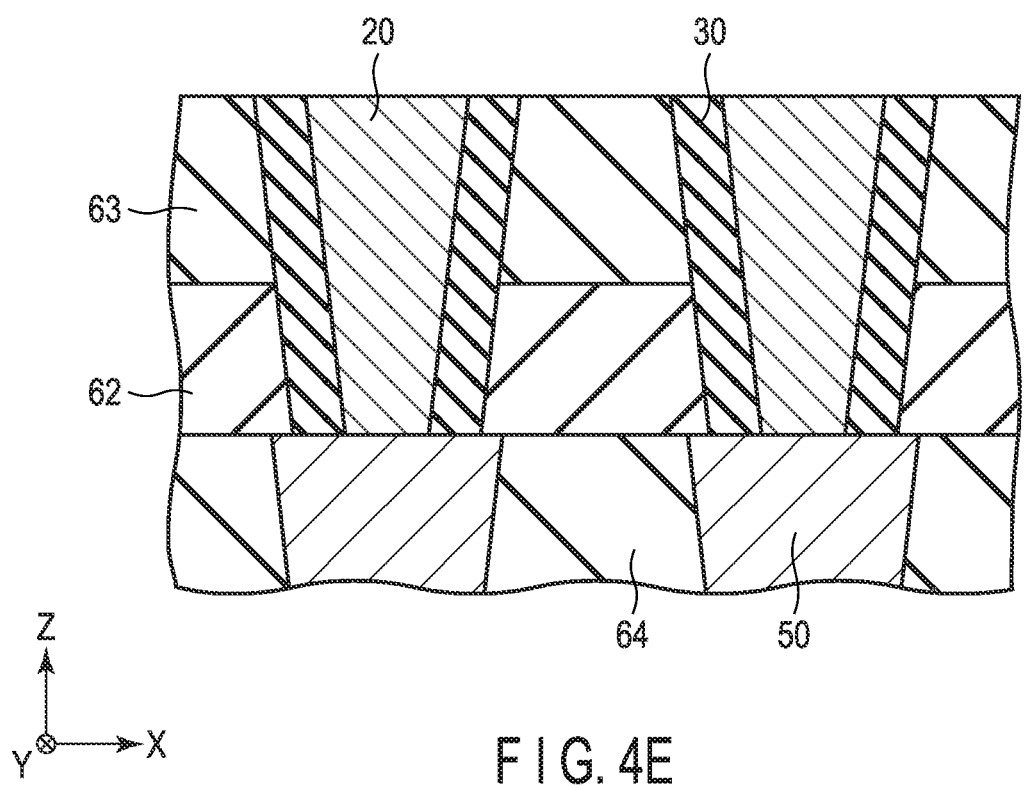

Next, as shown in FIG. 4E, the conductive layer 20a is subjected to a planarization process. As a result, the bottom electrode 20 is formed in the hole 70.

Figure 4F:
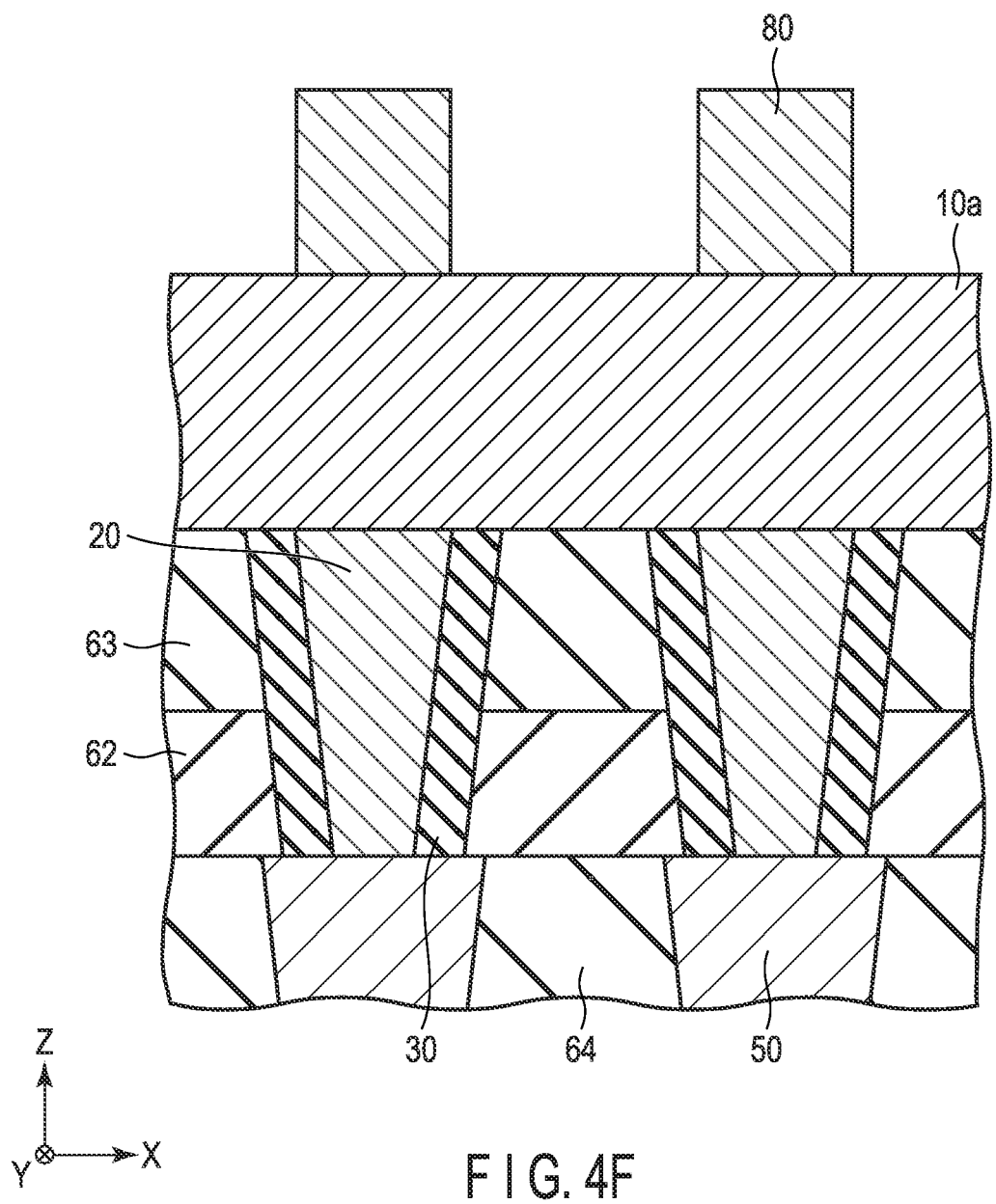

Subsequently, as shown in FIG. 4F, a stacked film 10a for the stacked structure 10 is formed on the structure obtained in the step of FIG. 4E. Then, a hard mask 80 is formed on the stacked film 10a. More specifically, the pattern of the hard mask 80 is formed so that the center of the pattern of the hard mask 60 coincides with the center of the pattern of the bottom electrode 20 as viewed from the Z direction and the diameter of the pattern of the hard mask 80 is less than the diameter of the outer circumference of the upper surface of the sidewall insulating layer 30.

Figure 4G:
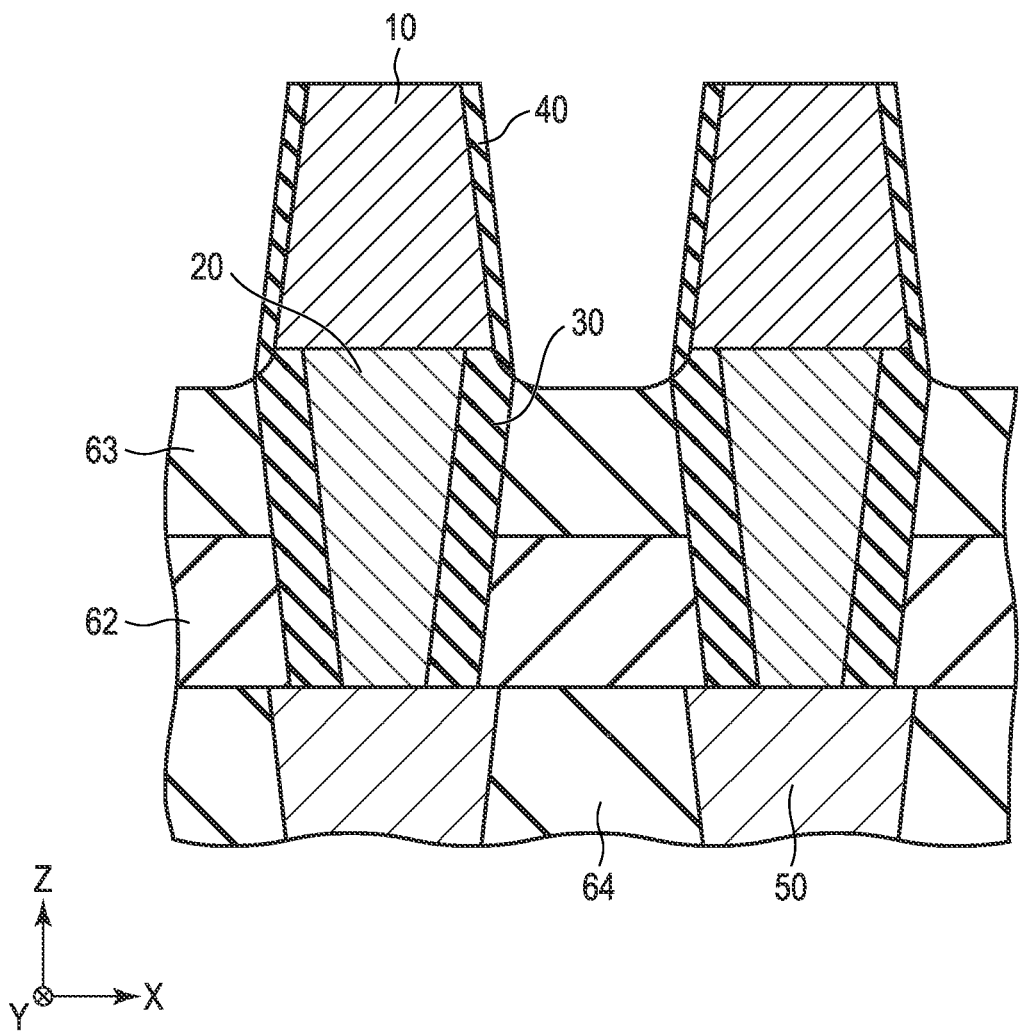

Next, as shown in FIG. 4G, using the hard mask AO as a mask, the stacked film 10a is etched by ion beam etching (IBE). As a result, the stacked structure 10 is formed. In the etching process using IBE, over-etching is performed to etch exposed portions near the outer circumference of the upper surface of the sidewall insulating layer 30. As a result, etching products of the sidewall insulating layer 30 are redeposited on the sidewall of the stacked structure 10 to form the sidewall insulating layer 40 on the sidewall of the stacked structure 10. That is, the MgO layer is formed on the sidewall of the stacked structure 10. If a part of the hard mask 80 remains at the end of the IBE, the remaining part of the hard mask 80 may be removed.

The composition ratio (Mg:O) of MgO which forms the sidewall insulating layer 40 may vary depending on the conditions of the IBE and the like. Therefore, the composition ratio (Mg:O) of the MgO which forms the sidewall insulating layer 30 and the composition ratio (Mg:O) of the MgO which forms the sidewall insulating layer 40 may be the same as or different from each other.

Thereafter, the insulating layer for the insulating region 61 is deposited, and further planarization processing is performed to obtain such a structure as shown in FIG. 1.

As described above, in this embodiment, the sidewall insulating layer 40 is formed on the sidewall of the stacked structure 10, and thus the characteristics of the magnetoresistance effect element can be improved as will re described below.

It is known that with a sidewall insulating layer, such as an MgO layer, on the sidewall of a magnetoresistance effect element, the characteristics of the magnetoresistance effect element can be improved. However, if the sidewall insulating layer is formed after the stacked structure of the magnetoresistance effect element is formed, such a problem arises that the coverage of the sidewall is insufficient. There is also a problem that it is difficult to remove the insulating layer for the sidewall insulating layer formed on the upper surface of the stacked structure with high controllability.

In this embodiment, as described in the step of FIG. 4G, when the stacked structure 10 is formed by etching the stacked film 10a, the part near the outer circumference of the upper surface of the sidewall insulating layer 30 formed on the sidewall of the bottom electrode 20 is etched. Then, the etching products are redeposited on the sidewall of the stacked structure 10, and thus the sidewall insulating layer 40 is formed. Further, the upper surface of the stacked structure 10 is protected by the hard mask 80, and even if the entire hard mask 80 is removed, ion beams are irradiated onto the upper surface of the stacked structure 10. Therefore, the insulating layer for the sidewall insulating layer is not formed on the upper surface of the stacked structure 10.

As described above, the sidewall insulating layer 40 can be formed precisely and efficiently on the sidewall of the stacked structure 10.

Moreover, the sidewall insulating layer 40 is formed in the process of etching the stacked film 10a to form the stacked structure 10, and thus it is possible to form the sidewall insulating layer 40 without adding any special process, thereby making it possible to reduce the number of steps in the manufacturing process.

As shown in FIG. 3, a part of the pattern of the upper surface of the sidewall insulating layer 30 is located on an outer side of the pattern of the lower surface of the stacked structure 10, and the diameter d1 of the outer circumference 30s1 of the upper surface of the sidewall insulating layer 30 is greater than the diameter d0 of the outer circumference 10s of the lower surface of the stacked structure 10. Therefore, in the etching process for forming the stacked structure 10, the part near the outer circumference of the upper surface of the sidewall insulating layer 30 can be reliably etched, and thus the sidewall insulating layer 40 can be reliably formed on the sidewall of the stacked structure 10 by the etching products.

Further, the diameter d2 of the inner circumference 30s2 of the upper surface of the sidewall insulating layer 30 is less than the diameter d0 of the outer circumference 108 of the lower surface of the stacked structure 10. With this structure, in the etching process to form the stacked structure 10, it is possible to etch only the sidewall insulating layer 30 without etching the bottom electrode 20. Therefore, only the components of the sidewall insulating layer 30 can be precisely redeposited on the sidewall of the stacked structure 10, thus making it possible to form an excellent sidewall insulating layer 40.

As described above, in this embodiment, with the sidewall insulating layer 40 formed on the sidewall of the stacked structure 10, it is possible to improve the characteristics of the magnetoresistance effect element.

Embodiment 2

Next, the second embodiment will be described. Note that the basic items are similar to those of the first embodiment, and the explanation of the items already provided in the first embodiment will be omitted.

Figure 5:
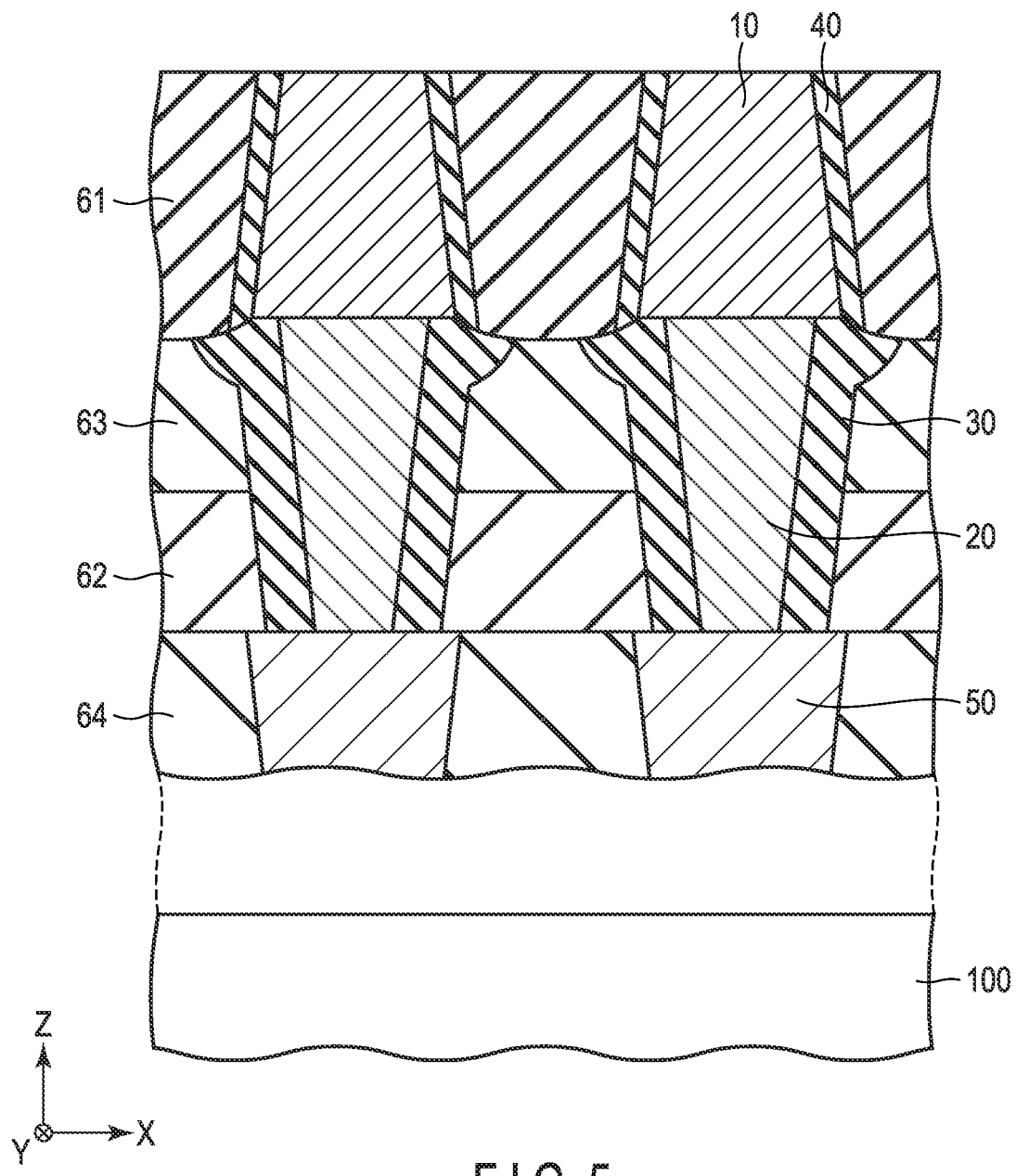
FIG. 5 is a cross-sectional view schematically illustrating a configuration of a magnetic memory device according to the second embodiment.

FIG. 5 is a cross-sectional view schematically showing a configuration of a magnetic memory device of this embodiment.

In this embodiment, an upper end portion of the sidewall insulating layer 30 protrudes outward. More specifically, the upper end portion of the sidewall insulating layer 30 protrudes outward when viewed from the 2 direction.

Figure 6:
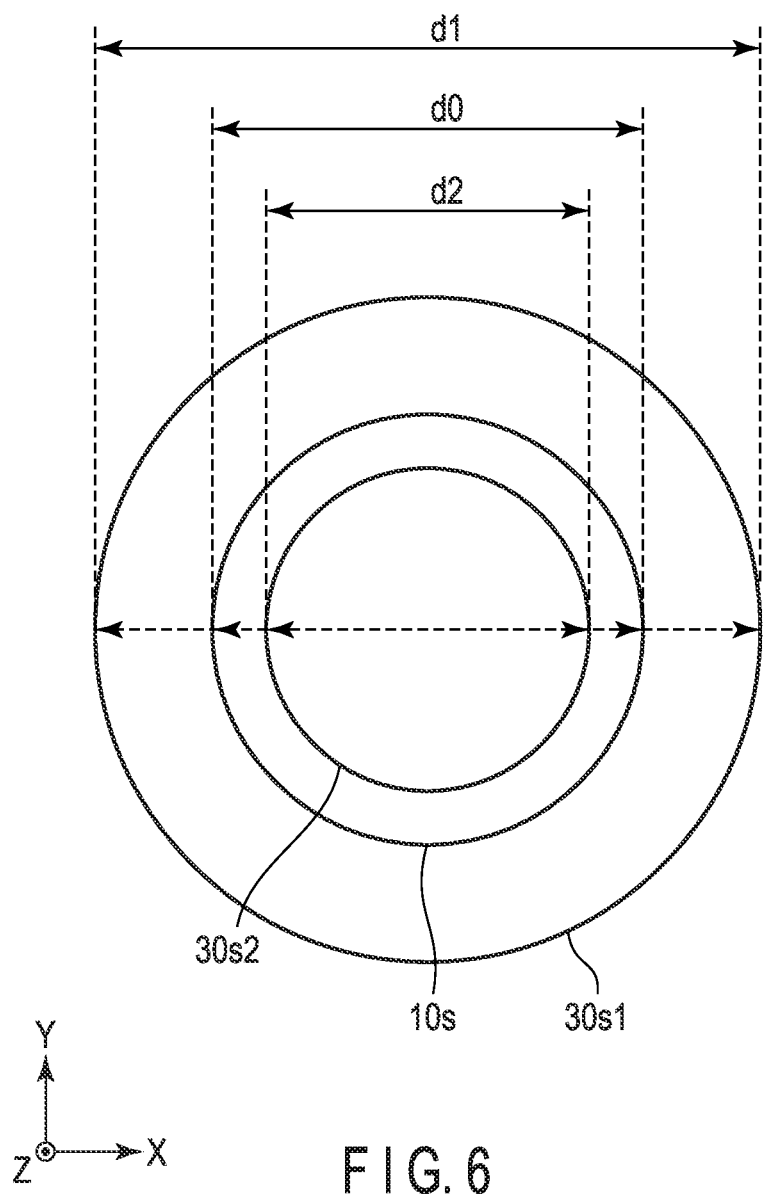
FIG. 6 is a diagram schematically showing the positional relationship between a pattern of a lower surface of the stacked structure and a pattern of an upper surface of the sidewall insulating layer of the magnetic memory device according to the second embodiment.

FIG. 6 is a diagram schematically showing the positional relationship between the pattern of the lower surface of the stacked structure 10 and the pattern of the upper surface of the sidewall insulating layer 30.

In this embodiment, the basic relationship between the outer circumference 10s of the lower surface of the stacked structure 10, the outer circumference 30s1 of the upper surface of the sidewall insulating layer 30 and the inner circumference 30s2 of the upper surface of the sidewall insulating layer 30 is similar to the relationship illustrated in FIG. 3 of the first embodiment. That is, it is preferably satisfy the relationship: d1>d0>d2. Note here that, in this embodiment, the upper end portion of the sidewall insulating layer 30 protrudes outward, and therefore the diameter of the outer circumference 30s1 of the upper surface of the sidewall insulating layer 30 is greater than that of the case shown in FIG. 3.

Next, a method of manufacturing the magnetic memory device of this embodiment will be described with reference to the cross-sectional views shown in FIGS. 7A to 7G.

Figure 7A:
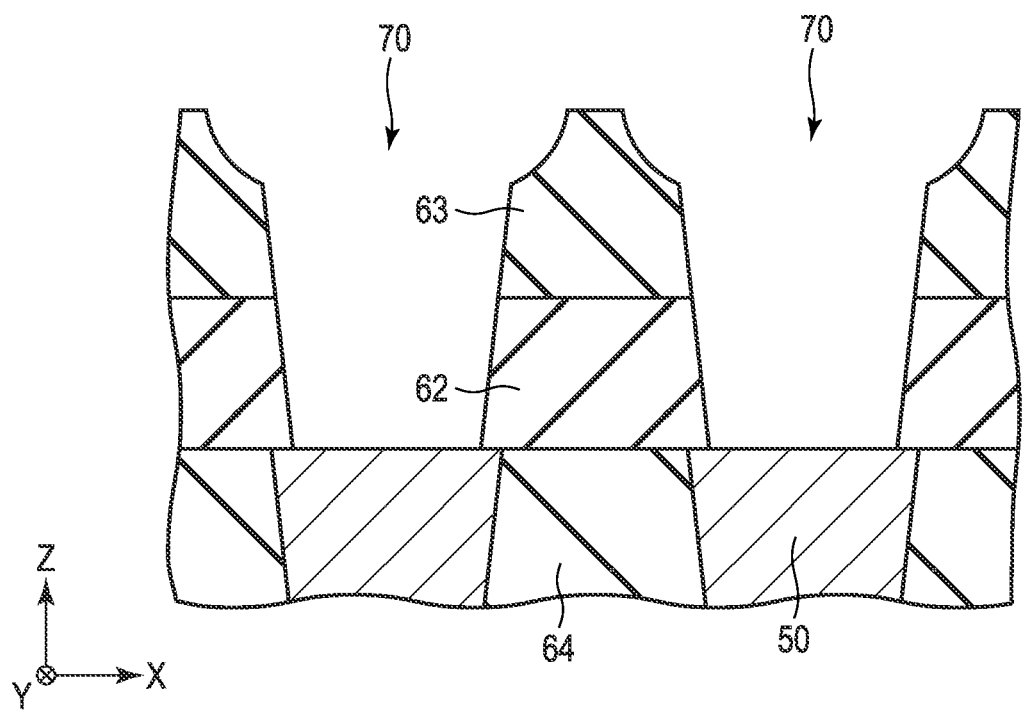
FIGS. 7A, 7B, 7C, 7D, 7E, 7F, and 7G are cross-sectional views each schematically illustrating a part of a manufacturing method for the magnetic memory device according to the second embodiment.

First, as shown in FIG. 7A, an insulating region 64 and a lower conductive layer 50 are formed or a lower region including a semiconductor substrate (not shown) and the like. Then, insulating layers for the insulating region 62 and the insulating region 63 are formed on the insulating region 64 and the lower conductive layer 50. Further, the insulating layers are patterned to form a plurality of holes 70.

Next, the outer circumference of the upper portion of each hole 70 obtained as described above is widened. More specifically, wet etching or dry etching is carried out while leaving the resist mask for forming the patterns of the insulating regions 62 and 63 on the insulating regions 63. Thus, the outer circumference of the upper surface of the insulating region 63 is etched, thus forming the hole 70 shown in FIG. 3.

The basic process thereafter is the same as that of the first embodiment.

Figure 7B:
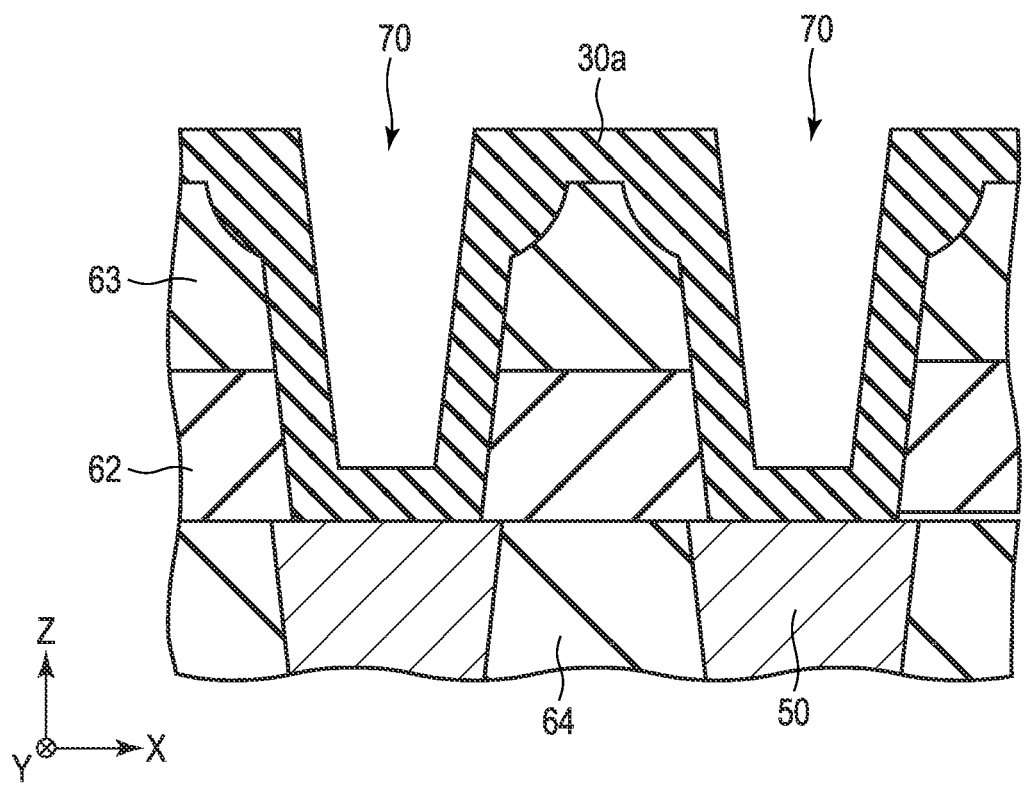
Figure 7C:
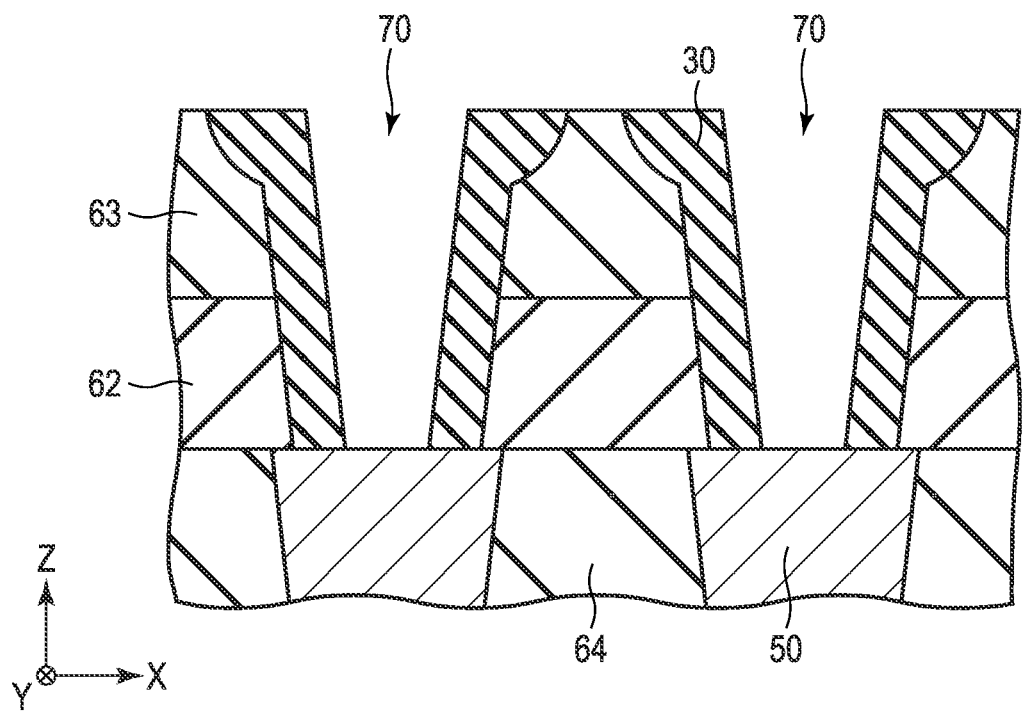
Figure 7D:
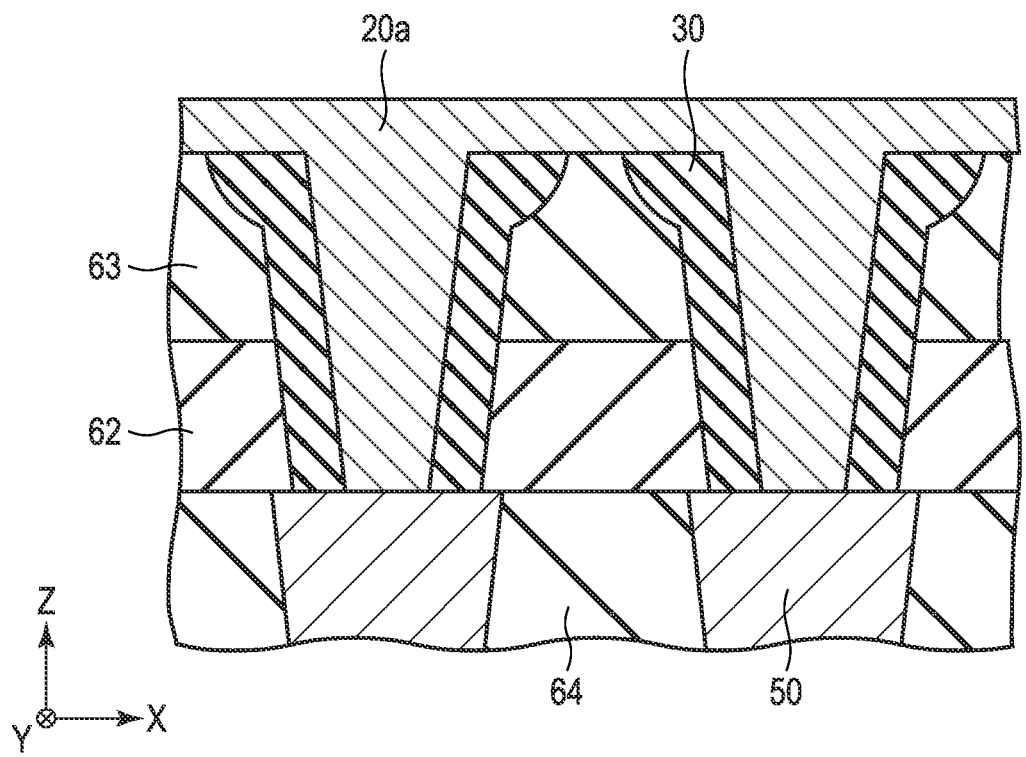
Figure 7E:
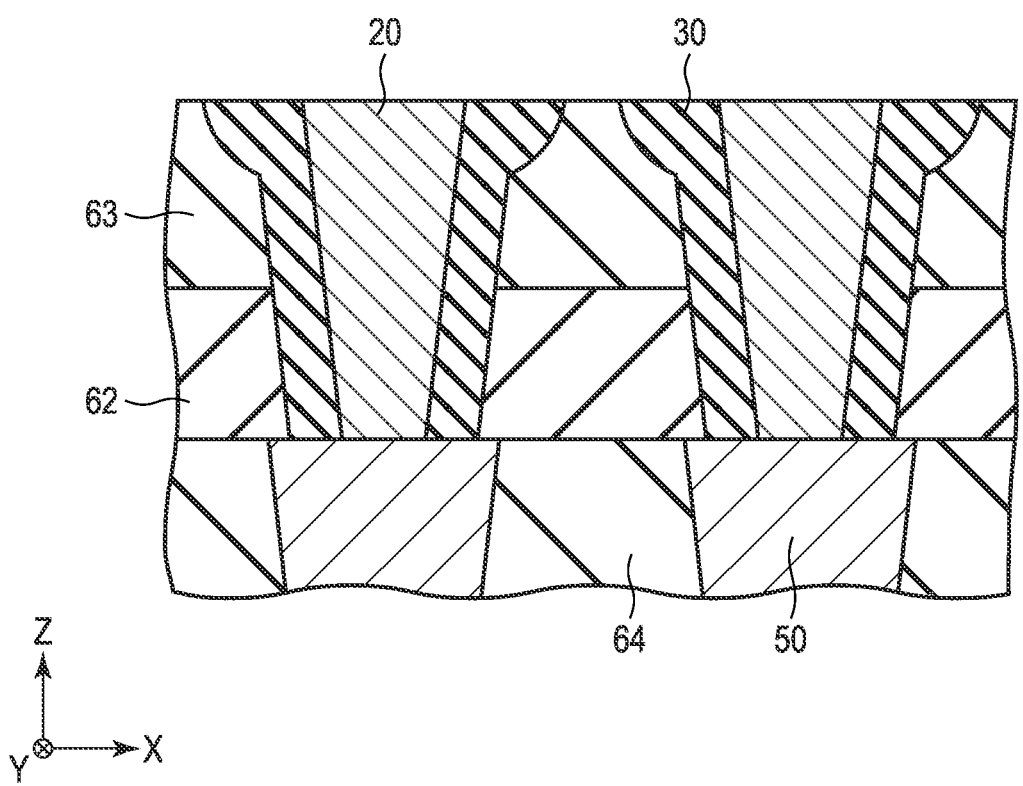
Figure 7F:
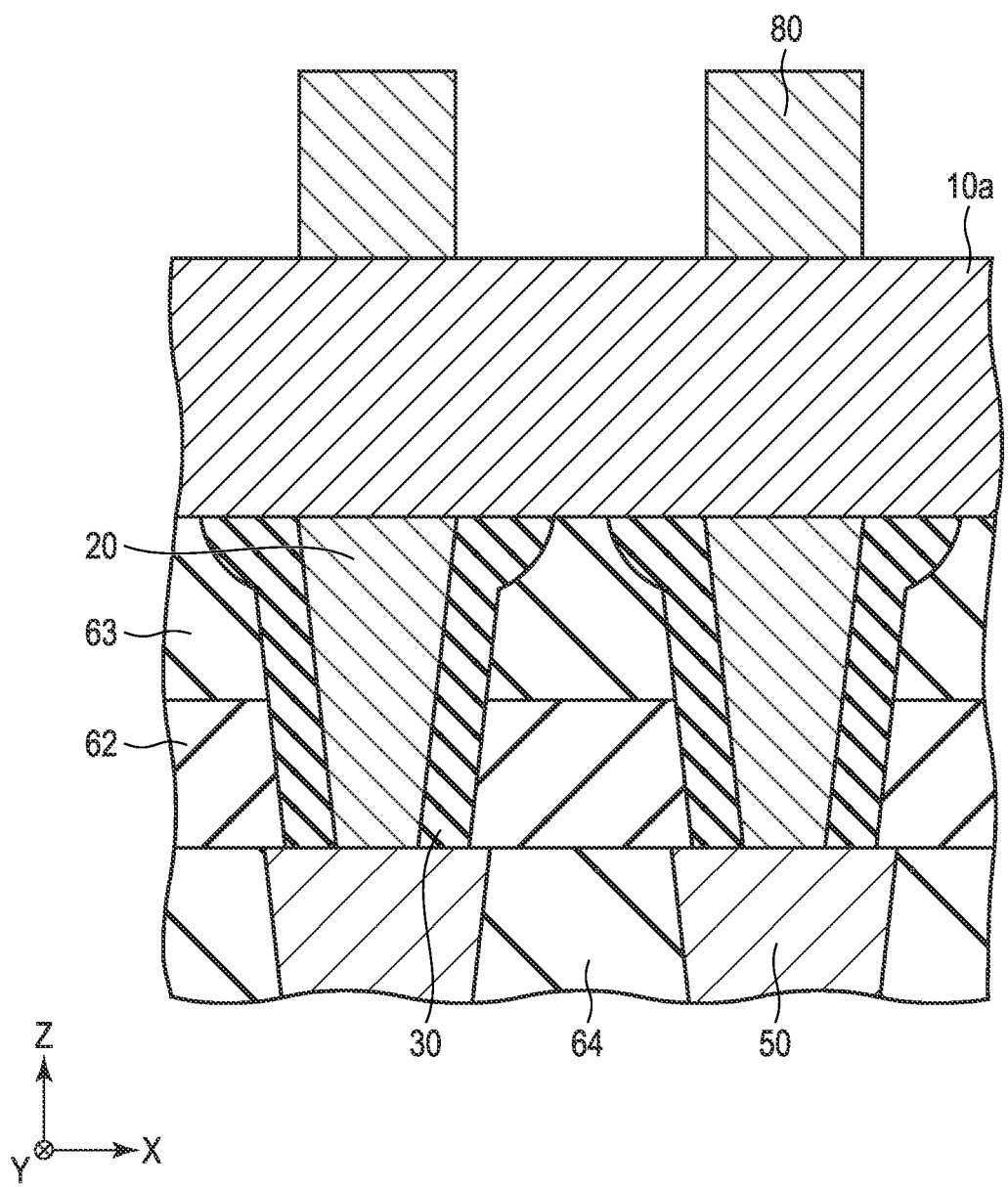
Figure 7G:
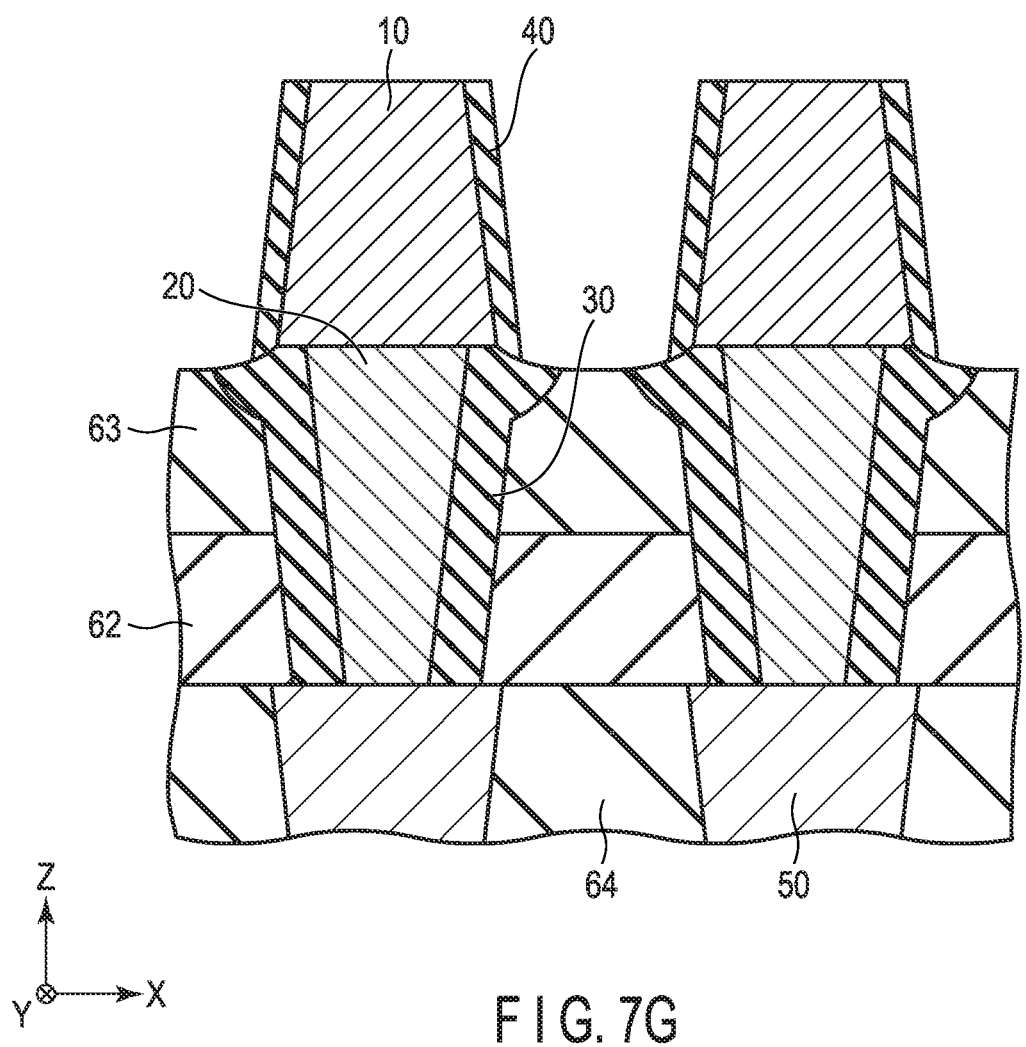

That is, the insulating layer 30a for the sidewall insulating layer 30 is formed in the step of FIG. 7B, and the sidewall insulating layer 30 is formed by carrying out the etch-back process in the step of FIG. 7C. Subsequently, the conductive layer 20a for the bottom electrode 20 is formed in the step of FIG. 70, and the bottom electrode 20 is formed in each hole 70 by carrying out the planarization process in the step of FIG. 7E. Then, in the step of FIG. 7F, a stacked film 10a for the stacked structure 10 and a hard mask 80 are formed. Further, in the step of FIG. 7G, the stacked structure 10 is formed by etching the stacked film 10a using the hard mask 80 as a mask. Thereafter, the insulating region 61 is formed, and thus such a structure as shown in FIG. 5 is obtained.

As described above, the basic structure and basic manufacturing method of the magnetic memory device of this embodiment are similar to those of the first embodiment. Therefore, advantageous effects to those described in the first embodiment can be obtained in this embodiment.

Further, in this embodiment, the upper end portion of the sidewall insulating layer 30 protrudes outward. With this structure, in the step of FIG. 7G, the area of the exposed portion near the outer circumference of the upper surface of the sidewall insulating layer 30 can be increased. Therefore, the etching area of the sidewall insulating layer 30 is increased, thus making it possible to deposit the etching products of the sidewall insulating layer 30 more efficiently and sufficiently on the sidewall of the stacked structure 10.

Application Example

Figure 8:
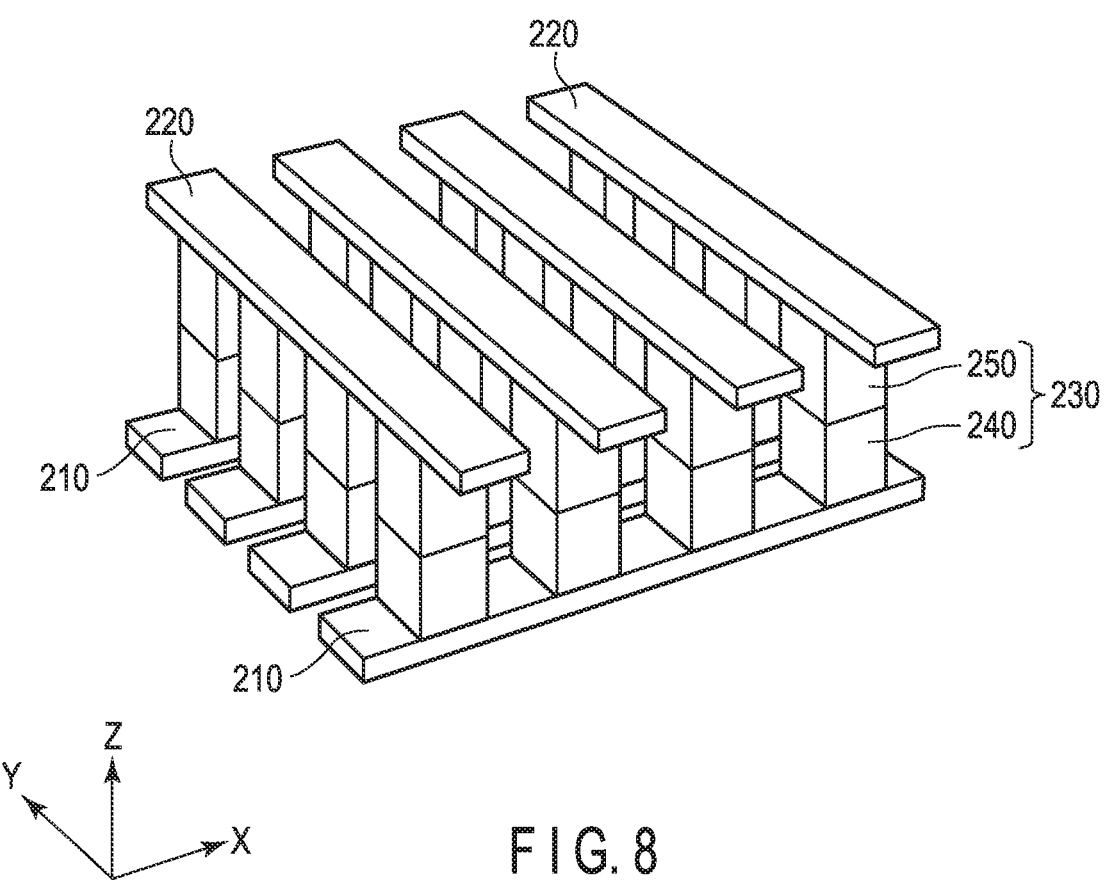
FIG. 8 is a perspective view schematically showing a configuration of a magnetic memory device to which the magnetoresistance effect element shown in the first or second embodiment is applied.

FIG. 8 is a perspective diagram schematically showing a magnetic memory device to which the magnetoresistance effect element shown in the first and second embodiments described above is applied.

The magnetic memory device shown in FIG. 8 comprises a plurality of first wires 210 extending in the X direction, a plurality of second wires 220 extending in the Y direction, and a plurality of memory cells 230 connected respectively between the first wires 210 and the second wires 220. For example, the first wires 210 correspond to word lines and the second wires 220 correspond to bit lines, or vice versa.

Each of the memory cells 230 includes a magnetoresistance effect element 240 and a selector (switching element) 250 connected in series to the magnetoresistance effect element 240.

By applying a predetermined voltage between the first wire 210 and the second wire 220 connected to the desired memory cell 230, the selector 250 included in the desired memory cell 230 is turned on, and thus reading or writing can be carried out with respect to the magnetoresistance effect element 240 included in the desired memory cell 230.

Note that the magnetic memory device shown in FIG. 8 has a configuration in which the selector 250 is provided on an upper layer side of the magnetoresistance effect element 240, but it may as well be of a configuration in which the selector 250 is provided on a lower layer side of the magnetoresistance effect element 240.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a semiconductor substrate;
   a bottom electrode provided above the semiconductor substrate;
   a stacked structure provided on the bottom electrode, the stacked structure including a first magnetic layer having a variable magnetization direction, a second magnetic layer having a fixed magnetization direction, and a nonmagnetic layer provided between the first magnetic layer and the second magnetic layer;
   a first sidewall insulating layer provided on a sidewall of the bottom electrode and containing a predetermined element and oxygen (O); and
   a second sidewall insulating layer provided on a sidewall of the stacked structure and containing the predetermined element and oxygen (O),
   wherein:
   the bottom electrode is provided between the semiconductor substrate and the stacked structure,
   a bottom surface of the stacked structure has a ring-shaped outer circumference in plan view with a diameter of do,
   an upper surface of the first sidewall insulating layer has a ring-shaped outer circumference in plan view with a diameter of d1;
   the upper surface of the first sidewall insulating layer has a ring-shaped inner circumference in plan view with a diameter of d2; and $d1 > d0 > d2$.

2. The device of claim 1, wherein the predetermined element is selected from magnesium (Mg), boron (B), aluminum (Al), scandium (Sc), titanium (Ti), vanadium (V), strontium (Sr), yttrium (Y), zirconium (Zr), niobium (Rb), molybdenum (Mo), barium (Ba), hafnium (Hf), tantalum (Ta) and tungsten (W).

3. The device of claim 1, wherein an upper end portion of the first sidewall insulating layer protrudes outward.

4. The device of claim 1, wherein the first sidewall insulating layer covers a side surface of the bottom electrode.

5. The device of claim 1, wherein the second sidewall insulating layer covers side surfaces of the first magnetic layer, the second magnetic layer, and the nonmagnetic layer.

6. The device of claim 1, wherein:
the stacked structure further includes a third magnetic layer configured to cancel a magnetic field applied from the second magnetic layer to the first magnetic layer, and
the second sidewall insulating layer covers side surfaces of the first magnetic layer, the second magnetic layer, the third magnetic layer, and the nonmagnetic layer.

7. The device of claim 1, wherein a side surface of the second sidewall insulating layer is covered by an insulating region formed of a material different from a material of the second sidewall insulating layer.

8. The device of claim 1, wherein a side surface of the first sidewall insulating layer is covered by an insulating region formed of a material different from a material of the first sidewall insulating layer.

9. The device of claim 1, wherein the stacked structure constitutes a magnetoresistance effect element.

10. The device of claim 1, wherein the lower surface of the stacked structure is in contact with the ring-shaped upper surface of the first sidewall insulating layer and an upper surface of the bottom electrode.

11. The device of claim 1, wherein the second sidewall insulating layer is provided on and in direct contact with the sidewall of the stacked structure.

12. The device of claim 1, wherein further comprising a lower conductive layer provided between the semiconductor substrate and the bottom electrode.

13. The device of claim 12, further comprising an insulating region containing silicon (Si) provided around the lower conductive layer.

14. The device of claim 1, wherein the predetermined element is selected from magnesium (Mg), boron (B), aluminum (Al), scandium (Sc), titanium (Ti), vanadium (V), strontium (Sr), yttrium (Y), zirconium (Zr), niobium (Rb), molybdenum (Mo), barium (Ba), hafnium (Hf), tantalum (Ta) and tungsten (W), and
wherein the magnetic memory device further comprises an insulating region containing silicon (Si) and provided around the first sidewall insulating layer.

15. The device of claim 1, wherein the predetermined element is selected from magnesium (Mg), boron (B), aluminum (Al), scandium (Sc), titanium (Ti), vanadium (V), strontium (Sr), yttrium (Y), zirconium (Zr), niobium (Rb), molybdenum (Mo), barium (Ba), hafnium (Hf), tantalum (Ta) and tungsten (W),
wherein the magnetic memory device comprises a first insulating region provided around part of the first sidewall insulating layer, and a second insulating region provided around another part of the first sidewall insulating layer,
wherein the second insulating region is stacked on the first insulating region,
wherein both the first and second insulating regions contain silicon (Si), and
wherein the first and second insulating regions are formed from different materials.

16. The device of claim 15, wherein one of the first and second insulating regions comprises silicon oxide, and the other of the first and second insulating regions comprises silicon nitride.

17. The device of claim 15, further comprising a third insulating region provided around the second sidewall insulating layer and containing silicon (Si).

18. The device according to claim 17, further comprising:
a lower conductive layer provided between the semiconductor substrate and the bottom electrode; and
a fourth insulating region containing silicon (Si) provided around the lower conductive layer.

* * * * *